United States Patent
Jau et al.

(10) Patent No.: US 9,389,660 B2
(45) Date of Patent: *Jul. 12, 2016

(54) RACK SERVER SYSTEM AND OPERATION METHOD APPLICABLE THERETO

(71) Applicant: Quanta Computer Inc., Tao Yuan Shien (TW)

(72) Inventors: Maw-Zan Jau, Taipei (TW); Tzu-Hung Wang, Keelung (TW); Chin-Hsiang Chan, Tao Yuan Shien (TW)

(73) Assignee: Quanta Computer Inc., Tao Yuan Shien (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/455,418

(22) Filed: Aug. 8, 2014

(65) Prior Publication Data

US 2015/0039918 A1 Feb. 5, 2015

Related U.S. Application Data

(63) Continuation of application No. 13/409,206, filed on Mar. 1, 2012, now Pat. No. 8,806,238.

(30) Foreign Application Priority Data

Jul. 28, 2011 (TW) .............................. 100126881 A

(51) Int. Cl.
| | |
|---|---|
| *G06F 1/26* | (2006.01) |
| *H02J 9/00* | (2006.01) |
| *H05K 7/14* | (2006.01) |
| *G06F 1/30* | (2006.01) |
| *G06F 1/32* | (2006.01) |
| *H04L 12/64* | (2006.01) |
| *H02J 9/06* | (2006.01) |
| *H02J 7/00* | (2006.01) |

(52) U.S. Cl.
CPC ........ *G06F 1/26* (2013.01); *G06F 1/305* (2013.01); *G06F 1/3234* (2013.01); *H02J 7/0063* (2013.01); *H02J 9/00* (2013.01); *H02J 9/005* (2013.01); *H02J 9/061* (2013.01); *H04L 12/6418* (2013.01); *H05K 7/1492* (2013.01); *H02J 2007/0067* (2013.01); *Y10T 307/50* (2015.04)

(58) Field of Classification Search
CPC ............. H02J 9/00; H02J 9/005; G06F 1/305; G06F 1/26
USPC ............. 713/300; 307/43; 320/112, 126, 127, 320/137; 702/63; 709/219; 714/14
See application file for complete search history.

(56) References Cited

U.S. PATENT DOCUMENTS

| | | | | |
|---|---|---|---|---|
| 5,420,493 | A * | 5/1995 | Hargadon et al. | 320/106 |
| 5,565,759 | A * | 10/1996 | Dunstan | 320/135 |
| 6,288,520 | B1 * | 9/2001 | Kim | 320/112 |
| 6,784,641 | B2 * | 8/2004 | Sakai et al. | 320/132 |

(Continued)

*Primary Examiner* — Stefan Stoynov
(74) *Attorney, Agent, or Firm* — Polsinelli PC

(57) ABSTRACT

A rack server system and an operating method applicable thereto are provided. The rack server system includes a battery backup unit (BBU) and at least one server. The operating method includes: communicating the server and the BBU with each other; the BBU providing a status information and a previous self-discharging test information to the server for the server to judge a status of the BBU; and providing power from the BBU to the server and adjusting a loading of the server according to the status information of the BBU when an input power is interrupted.

8 Claims, 2 Drawing Sheets

(56) References Cited

U.S. PATENT DOCUMENTS

| | | |
|---|---|---|
| 6,936,371 B2 * | 8/2005 | Komori et al. .................. 429/49 |
| 6,983,212 B2 * | 1/2006 | Burns ............................ 702/63 |
| 7,240,227 B2 * | 7/2007 | Maezawa ...................... 713/300 |
| 7,880,438 B1 * | 2/2011 | Cohen et al. ................. 320/132 |
| 8,179,094 B2 * | 5/2012 | Anupindi et al. ............. 320/132 |
| 8,307,222 B2 * | 11/2012 | Wang et al. ................... 713/300 |
| 8,355,965 B2 * | 1/2013 | Yamada ......................... 705/30 |
| 8,533,514 B2 * | 9/2013 | Rogers et al. ................. 713/340 |
| 8,612,801 B2 * | 12/2013 | Weilnau et al. ................ 714/22 |

* cited by examiner

RACK SERVER SYSTEM AND OPERATION METHOD APPLICABLE THERETO

This application is a continuation application of co-pending application Ser. No. 13/409,206, filed on Mar. 1, 2012, which has granted as U.S. Pat. No. 8,806,238, the contents of which are incorporated herein by reference. This application claims the benefit of Taiwan application Serial No. 100126881, filed Jul. 28, 2011, the subject matter of which is incorporated herein by reference.

TECHNICAL FIELD

The disclosure relates in general to a rack server system and more particularly to a rack server system and an operating method applicable thereto.

BACKGROUND

Blade servers have been widely used in various applications. A rack server system includes blade servers in a rack system for convenience of operation.

A blade server of the rack server system functions as a computer with complete functions. In other words, a blade server has peripheral devices such as a power supplier and a heat dissipation device in addition to its core components (such as CPU, motherboard, random access memory (RAM) and hard disc).

If AC-grid power is unstable, operations of the server will be unstable (such as shut-down) and data stored in the server may even be damaged. An uninterruptible power system (UPS) is used to avoid data loss and damage to electronic apparatus if power supply is abnormal, so as to effectively protect internal elements of the server and assure lifespan and accuracy of the server. However, reliability of existing UPS is still not satisfactory.

So, a battery backup unit (BBU) is in the rack server system to replace/assist the UPS for low cost, high efficiency and high stability.

However, during the battery module of the BBU is broken or unloaded for maintenance or service, the operation stability of the rack server system will be affected due to insufficient power supplied by the BBU if the AC-grid power happens to be unstable/abnormal/interrupted.

Besides, to maintain the normal operation of the BBU, a battery self-discharging test is performed every period of time so as to judge whether the battery of the BBU is normal according to a discharging curve thereof. During the battery self-discharging test, the operation stability of the rack server system will be affected due to insufficient power supplied from the BBU if the AC-grid power happens to be unstable/abnormal/interrupted.

In addition, among the current practices, during the BBU is maintained, the rack server system is usually turned off, which is inconvenient to user and/or administrator.

SUMMARY OF THE DISCLOSURE

The disclosure is directed to a rack server system and an operating method thereof. A battery backup unit (BBU) of the rack server system has a plurality of BBU sub-systems which are connected in parallel and operate independently. Therefore, when one of the BBU sub-system is broken or unloaded, other BBU sub-systems still provide power to servers for maintaining the normal operation of the servers even if the AC-grid power is interrupted.

According to one embodiment the present disclosure, an operating method applicable to a rack server system is provided. The rack server system includes a battery backup unit (BBU) and at least one server. The operating method includes: communicating the server and the BBU communicate with each other; the BBU provides a status information and a previous self-discharging test information to the server for the server to judge a status of the BBU; and providing power from the BBU to the server and adjusting a loading of the server according to the status information of the BBU when an input power is interrupted.

According to another embodiment the present disclosure, a rack server system including a battery backup unit (BBU) and at least one server is provided. The at least one server is coupled to the BBU. The server and the BBU communicate with each other. The BBU provides a status information and a previous self-discharging test information to the server for the server to judge a status of the BBU. When an input power is interrupted, the BBU provides power to the server, and the server adjusts its own loading according to the status information of the BBU.

It is to be understood that both the foregoing general description and the following detailed description are exemplary and explanatory only and are not restrictive of the disclosed embodiments, as claimed.

DETAILED DESCRIPTION OF THE DISCLOSURE

Figure 1:
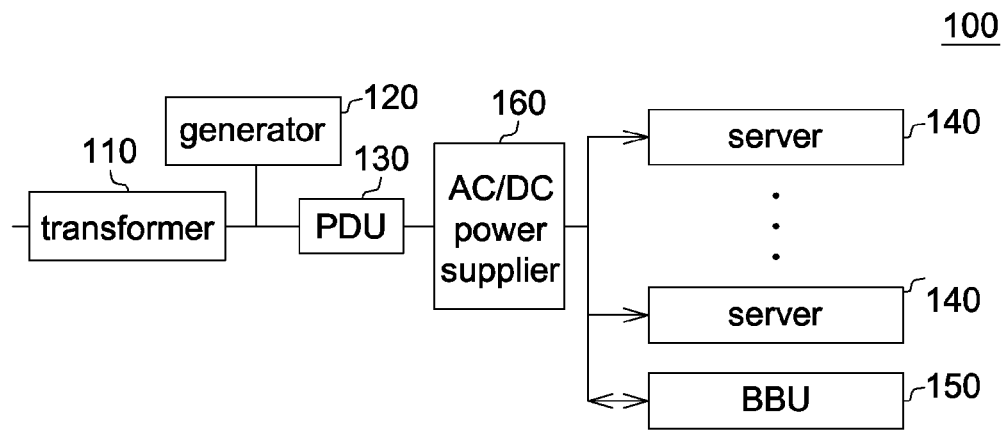
FIG. 1 shows a functional diagram of a rack server system according to one embodiment of the disclosure.

FIG. 1 shows a functional diagram of a rack server system according to one embodiment of the disclosure. As indicated in FIG. 1, the rack server system 100 includes: a transformer 110, a generator 120, a power distribution unit (PDU) 130, an AC/DC power supplier 160, at least one server 140 and a battery backup unit (BBU) 150. The number of the servers 140 is not restricted here. The numbers, functions and operations of the transformer 110, the generator 120, the PDU 130 and the AC/DC power supplier 160 are not restricted in the present embodiment of the disclosure.

In the present embodiment of the disclosure, if the AC-grid power becomes interruptible/unstable, the BBU 150 provides power to the servers 140. Then, the generator 120 is activated for providing AC power to the AC/DC power supplier 160 and the AC/DC power supplier 160 converts AC power into DC power and further provides DC power to the servers 140. That is, in the present embodiment of the disclosure, the time during which the BBU 150 provides power basically covers the time when the AC-grid power is detected as unstable to the time when the generator 120 is normally activated.

Figure 2:
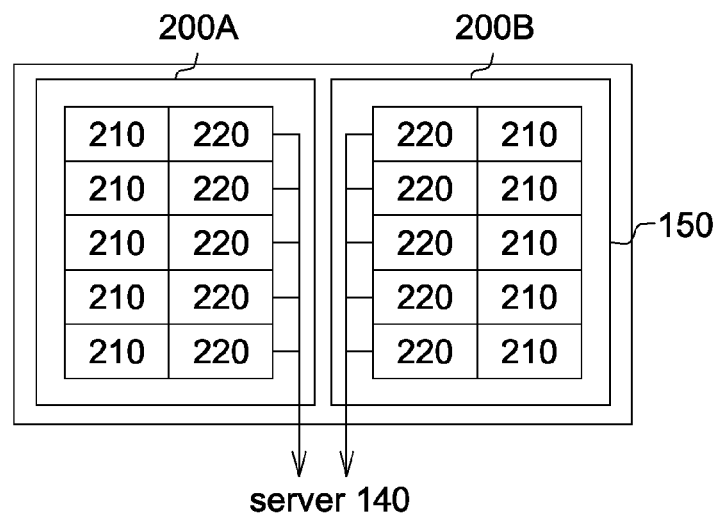
FIG. 2 shows a block diagram of a BBU according to one embodiment of the disclosure.

Referring to FIG. 2, a block diagram of the BBU 150 according to one embodiment of the disclosure is shown. As indicated in FIG. 2, the BBU 150 includes BBU sub-systems 200A and 200B. In FIG. 2, the BBU 150 includes two BBU sub-systems as an exemplification. However in other possible embodiments of the disclosure, the BBU may have one or more BBUs, and this is still within the spirit of the disclosure.

In the present embodiment of the disclosure, the BBU 150 includes BBU sub-systems 200A and 200B. When one of the BBU sub-systems is unloaded (due to such as breakdown, battery lifespan issue or replacement), another BBU sub-system still operates normally. Thus, maintenance or replacement of the BBU sub-system does not affect the BBU much. That is, when one of the BBU sub-system is broken or unloaded, another BBU sub-system provides power to maintain normal operations of the rack server system if the AC-grid power happens to be interruptible/unstable,.

Besides, the number of battery modules of the rack server system may be determined according to output power, such that system configuration and cost of the rack server system are more flexible. That is, if high output power is desired, the rack server system may have more battery modules, and vice versa.

Each of the BBU sub-systems 200A and 200B includes a plurality of battery modules 210 and a plurality of DC/DC converters 220. Despite one BBU sub-system includes five battery modules 210 as an exemplification in FIG. 2, but the disclosure is not limited thereto. In the present embodiment of the disclosure, one battery module 210 operates with one DC/DC converter 220. The DC/DC converter 220 converts the DC output voltage of the battery module 210 into a DC voltage required by the server 140. Also, for convenience of elaboration, one battery module 210 and one DC/DC converter 220 are referred as one BBU module.

The BBU sub-system may further have other elements such as a micro-controller (μp), a voltage detector, a blocking circuit, and that is still within the spirit of the disclosure. Exemplarily but not restrictively, a lithium battery is used as an energy storage device of the battery module 210 to reduce the size of the BBU.

The BBU sub-systems may be connected in parallel. In the present embodiment of the disclosure, modularization design makes easier for a designer to choose a fuse capable of protecting the battery module. Since a single DC/DC converter 220 normally outputs low voltage/current, it is thus easier to find a desired fuse.

Also, in the present embodiment of the disclosure, the DC/DC converter 220 further protects the battery module 210 from being negatively affected by external voltage change.

Let FIG. 2 be taken for example. One of purposes of unloading the BBU sub-system is for removing a BBU module disposed therein because the BBU module is more likely to be broken. Furthermore, the BBU sub-system 200A or 200B may be unloaded for replacing a BBU module disposed therein. Therefore, in the present embodiment of the disclosure, the BBU 150 includes a plurality of BBU sub-systems (in FIG. 2, two BBU sub-systems 200A and 200B are used as an exemplification, but the present embodiment of the disclosure is not limited thereto) and the advantage lies in that when anyone BBU module of the BBU is broken and is to be replaced, the BBU sub-system is unloaded and the BBU 150 still operates normally during replacement of the BBU module.

Figure 3:
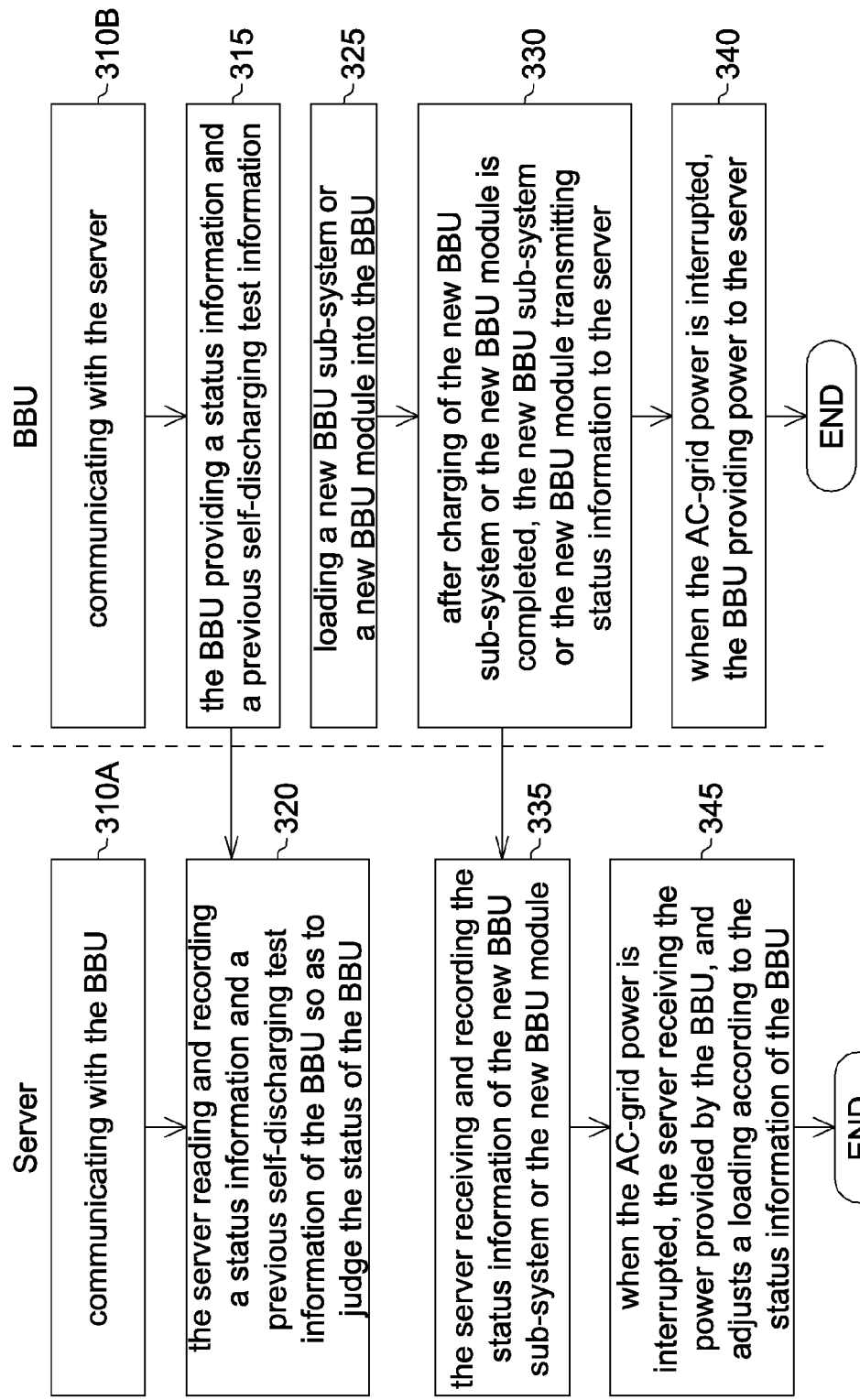
FIG. 3 shows a control flowchart of the server and the BBU according to one embodiment of the disclosure.

Referring to FIG. 3, a control flowchart of a server end and a BBU end according to one embodiment of the disclosure is shown. In steps 310A and 310B, the server and the BBU communicate with each other. In step 315, the BBU provides its status information and previous self-discharging test information (such as a test time of a previous self-discharging test) to the server.

In order to obtain the charging/discharging status of the battery module, the BBU performs a self-discharging test on the battery modules every one period of the time for discharging the battery modules so that the discharging curves of the battery modules are obtained. Based on the discharging curves, whether the battery modules are normal or broken is checked. If the battery module is disqualified or broken, the BBU records the information and may store this information in an internal memory (not shown) of the BBU sub-system. The status information provided by the BBU is such as how many of the battery modules are qualified, how many are disqualified and how many are broken. Basically, the self-discharging test is performed on the battery modules one at a time until all battery modules are tested.

Furthermore, in the present embodiment of the disclosure, when self-discharging test is performed on one of the battery modules of the BBU sub-system, other battery modules of this BBU sub-system still normally provide power and another normal BBU sub-systems (if any) also normally provides power to the server (that is, the BBU 150 normally provides power to the server) if the AC-grid power happens to be interrupted. Thus, the operation of the server is not affected by the interruption of the AC-grid power. In the present embodiment of the disclosure, the BBU sub-system has a plurality of battery modules. When one or more than one battery module is broken or disqualified, the BBU 150 and the server may record the information. Thus, despite one or more battery module is broken or disqualified, the operation of the server may be not affected.

Furthermore, suppose the BBU has only one BBU sub-system. When self-discharging test is performed on one of the battery modules of the BBU sub-system, the BBU sub-system immediately stops the self-discharging test on the battery module under test and other battery modules normally provide power to the server if the AC-grid power happens to be interrupted. Thus, the operation of the server is not affected by the interruption of the AC-grid power.

In step 320, the server reads and records the BBU status information and the previous self-discharging test information from the BBU so as to judge the status of the BBU (such as whether anyone BBU sub-system is unloaded/broken, and the status of the battery modules). Let FIG. 2 be taken for example, the BBU has two BBU sub-systems. If the information provided by the BBU indicates that this information is only related to one BBU sub-system, this implies that the other one of the BBU sub-systems may be unloaded/broken.

In step 325, suppose a BBU sub-system or a BBU module is unloaded, so a new BBU sub-system or a new BBU module is loaded into the BBU. Or, suppose a BBU sub-system or a BBU module is broken, so the broken BBU sub-system or BBU module is unloaded and a new BBU sub-system or a new BBU module is loaded into the BBU.

In step 330, after charging of the new BBU sub-system or the new BBU module is completed, the new BBU sub-system or the new BBU module transmits its own status information to the server. In the present embodiment of the disclosure, the BBU system, the BBU sub-system or the BBU module judges whether the charging is completed. For example, a micro-controller of the BBU, a micro-controller of the BBU sub-system or a micro-controller of the BBU module judges whether the charging of the battery module is completed. In addition, the status information may be stored in the BBU.

In step 335, the server receives and records the status information of the new BBU sub-system or the new BBU module. In the present embodiment of the disclosure, steps 325~335 are not compulsory steps. That is, if all BBU sub-systems of the BBU are normal, steps 325~335 may be skipped.

In step 340, when the AC-grid power is interrupted, the BBU provides power to the server. In step 345, when the AC-grid power is interrupted, the server receives the power provided by the BBU and adjusts server loading according to the status information of the BBU. In the present embodiment of the disclosure, whether the AC-grid power is interrupted may be detected by the BBU alone, by the server alone, or by the BBU and the server together, and any arrangement is still within the spirit of the disclosure.

For example, the BBU has 10 battery modules. If the status information of the BBU indicates that all 10 battery modules are normal, then the server may adjust the server loading (for example, at a maximum working loading) according to the status information when the AC-grid power is interrupted. Here, the maximum working loading refers to a CPU (not illustrated) and/or a memory (not illustrated) of the server operates at full speed. However, if the status information of the BBU indicates that 9 of the 10 battery modules are normal, then the server may adjust its own loading according to the status information when the AC-grid power is interrupted. For example, in this case, the server may operate at 90% of the maximum working loading; or the CPU and/or the memory operates at 90% of full speed. The rest can be obtained by analogy.

Also, in the present embodiment of the disclosure, when one of the BBU sub-systems is unloaded, the server records the information, such that the server may adjust its own loading according to the information if the AC-grid power is interrupted.

It will be appreciated by those skilled in the art that changes could be made to the disclosed embodiments described above without departing from the broad inventive concept thereof. It is understood, therefore, that the disclosed embodiments are not limited to the particular examples disclosed, but is intended to cover modifications within the spirit and scope of the disclosed embodiments as defined by the claims that follow.

What is claimed is:

1. A method for controlling a battery backup unit (BBU) configured to hold at least one BBU sub-system, each BBU sub-system including at least one battery module, the method comprising:
   receiving a new BBU sub-system in the BBU, the new BBU sub-system including at least one undercharged battery module;
   charging, after the receiving, the at least the one undercharged battery module;
   determining that the charging is complete, the determining being performed by any one of the BBU, the new BBU sub-system, at least one of the battery modules in the new BBU sub-system; and
   updating, in response to the determining, the status information in a memory,
   wherein while the at least one BBU sub-system in the BBU is unfunctional and the input power is outside of normal operating tolerances, another one of a plurality of BBU sub-systems in the BBU provides power to a server coupled to the BBU, and the server records relevant information such that the server adjusts its own loading according to the relevant information; and
   while a self-discharging test is performed on the at least one battery module of each BBU sub-system and the input power is outside of normal operating tolerances, other battery modules of the plurality of BBU sub-systems provide power to the server.

2. The method of claim 1, wherein the charging comprises charging only the battery modules within the new BBU sub-system that require charging.

3. The method of claim 1, receiving a new BBU sub-system in the BBU comprises receiving a repaired older BBU sub-system.

4. A rack server system, comprising:
   a battery backup unit (BBU); and
   at least one server coupled to the BBU;
   wherein,
      the BBU provides status information and previous self-discharging test information to the server for the server to judge a status of the BBU; and
      when an input power is outside of normal operating tolerances, the BBU provides power to the server, and the server adjusts its own loading according to the status information of the BBU;
      wherein after a new BBU sub-system is loaded into the BBU, at least any one of the BBU, the new BBU sub-system, or battery modules within the BBU sub-system determines whether charging is completed, and wherein after charging is judged to be completed, the BBU stores the status information;
      wherein the server receives and records the status information of the new BBU sub-system;
      if one of a plurality of BBU sub-systems in the BBU is unloaded or broken, another one of the plurality of BBU sub-systems in the BBU provides power to the server when the input power is outside of normal operating tolerances;
      while a self-discharging test is performed on one of the BBU modules of the one of the plurality of BBU sub-systems, other BBU modules of the one of the plurality of BBU sub-systems provide power to the server if the input power is outside of normal operating tolerances; and
      while the one of the plurality of BBU sub-systems is unloaded or broken, the server records relevant information, such that the server adjusts its own loading according to the relevant information if the input power is outside of normal operating tolerances.

5. The rack server system according to claim 4, wherein each one of the plurality of BBU sub-systems comprises a plurality of battery modules and a plurality of converters, and one of the battery modules operates with one of the converters.

6. The rack server system according to claim 5, further comprising:
   determining the number of battery modules of said plurality of battery modules according to an output power of the rack server system;
   wherein the battery module comprises a lithium rechargeable battery.

7. The rack server system according to claim 5, wherein the server is configured for at least one of judging whether any one of the plurality of BBU sub-systems or any BBU module is unloaded or broken or judging a status of the battery modules.

8. The rack server system, according to claim 5, further comprising, after charging is judged to be complete, the new BBU sub-system transmits its status information to the server.

* * * * *